US011158567B2

(12) United States Patent
Kim et al.

(10) Patent No.: US 11,158,567 B2
(45) Date of Patent: Oct. 26, 2021

(54) PACKAGE WITH STACKED POWER STAGE AND INTEGRATED CONTROL DIE

(71) Applicant: TEXAS INSTRUMENTS INCORPORATED, Dallas, TX (US)

(72) Inventors: Woochan Kim, San Jose, CA (US); Vivek Kishorechand Arora, San Jose, CA (US); Benjamin Allen Samples, Albany, OR (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/537,517

(22) Filed: Aug. 9, 2019

(65) Prior Publication Data
US 2021/0043551 A1 Feb. 11, 2021

(51) Int. Cl.
H01L 23/495 (2006.01)
H05K 7/14 (2006.01)
H01L 23/34 (2006.01)
H01L 23/00 (2006.01)

(52) U.S. Cl.
CPC ........ H01L 23/49575 (2013.01); H01L 23/34 (2013.01); H01L 23/49537 (2013.01); H01L 24/75 (2013.01); H05K 7/1432 (2013.01); H01L 2224/32145 (2013.01)

(58) Field of Classification Search
CPC ............... H01L 23/49575; H01L 24/75; H01L 23/49537; H01L 23/34; H01L 2224/32145; H05K 7/1432
USPC ....................................................... 257/676
See application file for complete search history.

(56) References Cited

U.S. PATENT DOCUMENTS

| 5,403,784 A | 4/1995 | Hashemi et al. |
| 5,569,625 A | 10/1996 | Yoneda et al. |
| 5,663,597 A | 9/1997 | Nelson et al. |
| 6,396,136 B2 | 5/2002 | Kalidas et al. |
| 6,574,107 B2 | 6/2003 | Jeon et al. |
| 7,135,759 B2 | 11/2006 | Efland et al. |

(Continued)

FOREIGN PATENT DOCUMENTS

EP 1376747 A2 1/2004

OTHER PUBLICATIONS

LMG341xR070 600-V 70-mΩ GaN with Integrated Driver and Protection, Texas Instruments Incorporated, Dallas, Texas, Oct. 2018.

(Continued)

*Primary Examiner* — Vu A Vu
(74) *Attorney, Agent, or Firm* — Dawn Jos; Charles A. Brill; Frank D. Cimino

(57) ABSTRACT

A package includes a semiconductor die forming a power field effect transistor (FET), a control die, and a first leadframe. The control die is arranged on a first surface of the first leadframe, and the semiconductor die is arranged on an opposing second surface of the first leadframe. The package further includes a second leadframe including a first surface and a second surface opposing the first surface, wherein the semiconductor die is arranged on the first surface of the second leadframe to facilitate heat transfer therethrough. The package also includes mold compound at least partially covering the semiconductor die, the control die, the first leadframe and the second leadframe with the second surface of the second leadframe exposed.

17 Claims, 10 Drawing Sheets

(56) References Cited

U.S. PATENT DOCUMENTS

| | | | |
|---|---|---|---|
| 7,838,340 B2 | 11/2010 | Cruz et al. | |
| 8,299,588 B1 | 10/2012 | Tateishi et al. | |
| 8,354,303 B2 | 1/2013 | Lopez et al. | |
| 8,450,149 B2 * | 5/2013 | Bayan | H01L 24/97 438/108 |
| 8,524,532 B1 | 9/2013 | Joshi | |
| 8,822,273 B2 | 9/2014 | Kuo et al. | |
| 8,884,414 B2 | 11/2014 | Lee et al. | |
| 8,946,880 B2 | 2/2015 | Saye | |
| 9,177,945 B2 | 11/2015 | Saye | |
| 9,300,222 B2 | 3/2016 | Moss | |
| 9,373,571 B2 | 6/2016 | Denison et al. | |
| 9,583,477 B2 * | 2/2017 | Cho | H01L 23/49562 |
| 9,589,929 B2 * | 3/2017 | Terrill | H01L 23/49513 |
| 9,601,453 B2 * | 3/2017 | Hebert | H01L 24/37 |
| RE46,466 E | 7/2017 | Lange et al. | |
| 9,842,797 B2 * | 12/2017 | Carpenter | H01L 24/37 |
| 10,056,819 B1 | 8/2018 | Couleur et al. | |
| 2013/0127029 A1 | 5/2013 | Lee et al. | |
| 2016/0172279 A1 | 6/2016 | Cho | |
| 2016/0231759 A1 * | 8/2016 | Lofthouse | H02M 3/156 |
| 2016/0286656 A1 * | 9/2016 | Cho | H01L 23/495 |
| 2017/0125324 A1 | 5/2017 | Joshi et al. | |
| 2019/0013288 A1 | 1/2019 | Kim et al. | |

OTHER PUBLICATIONS

U.S. Appl. No. 16/222,920, titled Package With Dual Layer Routing Including Ground Return Path, filed Dec. 17, 2018.

* cited by examiner

PACKAGE WITH STACKED POWER STAGE AND INTEGRATED CONTROL DIE

TECHNICAL FIELD

This disclosure relates to semiconductor packages.

BACKGROUND

Among the long-term trends in semiconductor technology which continue unabated are the trends towards miniaturization, integration, and speed. Electronic products in commercial applications such as telecom, home audio, and regulator products often need power supply systems, which can switch power supplies, regulate and stabilize voltages, and/or work as power converters, such as AC to AC, AC to DC, DC to AC and DC to DC converters.

Popular power switch systems involve a metal leadframe onto which a plurality of discrete electronic components are assembled and overmolded as a unit. In operation, the components have to stay cool by effectively dissipating heat to heat sinks so that they can switch fast (fast transient response).

Intelligent power modules combine power supply, regulation, and switching components with dedicated controllers. The dedicated controllers may provide features intended to improve performance and reliability, such as over-current protection, over-temperature protection, and under voltage lockout. The components of an intelligent power module, such as low voltage controllers, sensors, and control dies, as well as high-voltage power switches, such as power field effect transistors (FETs) are interconnected through a common underlying circuit, such as a printed circuit board (PCB).

BRIEF SUMMARY

Packages disclosed herein include a semiconductor die with a power stage and a control die on opposing surfaces of a first leadframe and a second leadframe that provides a ground return path within the package and facilitates conductive cooling from the semiconductor die. The disclosed techniques may be applied to integrate a control die and semiconductor die including a power stage within a single package. Including a ground return path within the package provides for a lower impedance for electronic signals between the semiconductor die and a control die as compared to packages that rely on the ground plane of an underlying circuit. Limiting the impedance of the signal path may mitigate voltage overshoot, thereby facilitating higher frequency communications, as voltage overshoot can interfere with signal transmission. In some examples, the control die supports features for an intelligent power module such as over-current protection, over-temperature protections and under voltage lockout for the semiconductor die.

In one example, a package includes a semiconductor die forming a power stage with a power stage source, a power stage drain, and a power stage gate, a control die forming control die electrical contacts including a control input, a gate drive output, and a control power input, and a first leadframe including a first surface and a second surface opposing the first surface, the first leadframe forming a die attach site, a power stage gate conductor and a plurality of leads, the plurality of leads including: a power stage source lead, a power stage drain lead, a power stage drain lead, a control input lead, and a control power input lead. The control die is arranged on the first surface of the first leadframe such that the control input is electrically coupled to the control input lead, the gate drive output is electrically coupled to the power stage gate conductor, and the control power input is electrically coupled to the control power input lead. The semiconductor die is arranged on the second surface of the first leadframe at the die attach site such that the power stage source is electrically coupled to the power stage source lead, the power stage drain is electrically coupled to the power stage drain lead, and the power stage gate is electrically coupled to the power stage gate conductor. The package further includes a second leadframe including a first surface and a second surface opposing the first surface, wherein the semiconductor die is arranged on the first surface of the second leadframe to facilitate heat transfer therethrough, and mold compound at least partially covering the semiconductor die, the control die, the first leadframe and the second leadframe with the second surface of the second leadframe exposed.

In another example, a method of forming a package includes arranging a control die on a first surface of a first leadframe, the control die forming control die electrical contacts including a control input, a gate drive output, and a control power input. The first leadframe includes a first surface and a second surface opposing the first surface, the first leadframe forming a die attach site, a power stage gate conductor and a plurality of leads, the plurality of leads including: a power stage source lead, a power stage drain lead, a control input lead, and a control power input lead. The control die is arranged on the first surface of the first leadframe such that the control input is electrically coupled to the control input lead, the gate drive output is electrically coupled to the power stage gate conductor, and the control power input is electrically coupled to the control power input lead. The method further includes arranging a semiconductor die on the second surface of the first leadframe at the die attach site, the semiconductor die forming a power stage with a power stage source, a power stage drain, and a power stage gate. The semiconductor die is arranged on the second surface of the first leadframe at the die attach site such that the power stage source is electrically coupled to the power stage source lead, the power stage drain is electrically coupled to the power stage drain lead, and the power stage gate is electrically coupled to the power stage gate conductor. The method further includes arranging the semiconductor die on a first surface of a second leadframe to facilitate heat transfer therethrough, and covering portions of the control die, the semiconductor die, the first leadframe, and the second leadframe with mold compound, leaving a second surface of the second leadframe exposed, the second surface of the second leadframe opposing the first surface of the second leadframe.

In another example, a package includes a gallium nitride die forming a power stage with a power stage source, a power stage drain, and a power stage gate. A voltage rating of the power stage for at least one of the power stage source, and the power stage drain is at least 100 volts. The package further includes a control die forming control die electrical contacts including a control input, a gate drive output, and a control power input, and a first leadframe including a first surface and a second surface opposing the first surface, the first leadframe forming a die attach site, a power stage gate conductor and a plurality of leads, the plurality of leads including: a power stage source lead, a power stage drain lead, a control input lead, and a control power input lead. The control die is arranged on the first surface of the first leadframe in a first flipchip arrangement such that the control input is electrically coupled to the control input lead, the gate drive output is electrically coupled to the power stage gate conductor, and the control power input is electrically coupled to the control power input lead. The gallium nitride die is arranged on the second surface of the first leadframe at the die attach site in a second flipchip arrangement such that the power stage source is electrically coupled to the power stage source lead, the power stage drain is electrically coupled to the power stage drain lead, and the power stage gate is electrically coupled to the power stage gate conductor. The power stage is operable via the power stage gate with a signal of less than 15 volts. The package further includes a second leadframe including a first surface and a second surface opposing the first surface, wherein the gallium nitride die is arranged on the first surface of the second leadframe to facilitate heat transfer therethrough, and mold compound at least partially covering the gallium nitride die, the control die, the first leadframe and the second leadframe with the second surface of the second leadframe exposed.

DETAILED DESCRIPTION

Figure 1A:
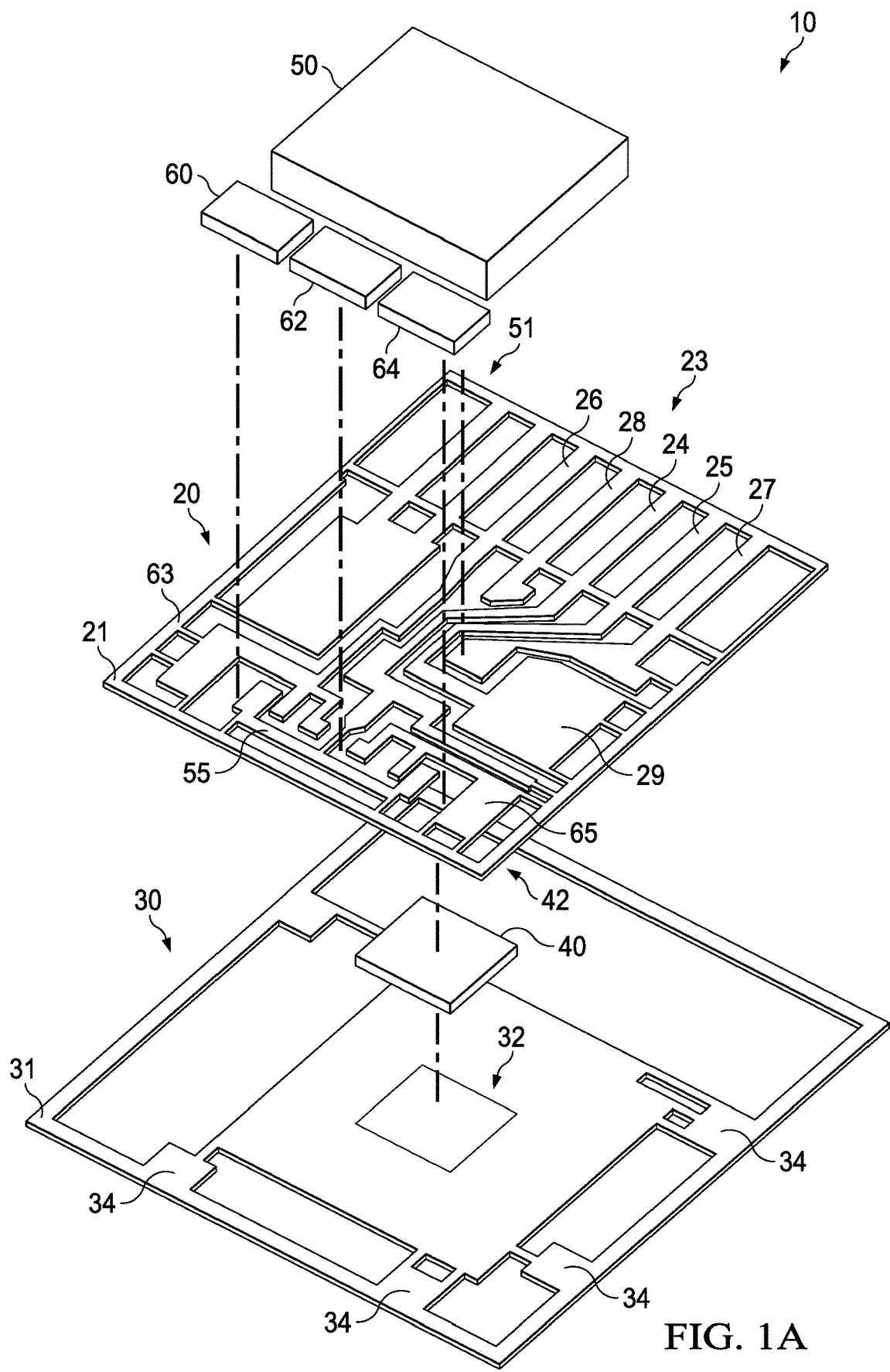
FIGS. 1A and 1B illustrate a semiconductor package including a power stage and a control die on opposing surfaces of a first leadframe, and a second leadframe that provides a ground return path within the package and facilitates conductive cooling from the power stage.

In contrast to the availability of integrated power converters, such a buck converters, intelligent power modules tend to be larger assemblies with limited integration. Power switches and their control die circuits may include a number of components electrically coupled through a common underlying circuit, such as a PCB. The separation of components in an intelligent power module supports cooling of the components, allows the same components to be used in a wide number of applications, and allows customization of the control die circuit.

However, the separation of components of intelligent power module may also limit the speed of control signals and switching due to the impedance of the control signal loop. For example, a control signal loop includes the direct connection between a control die and a power stage as well as a ground return path. Larger physical control signal loops result in larger impedances. Further integration of power switch components supports faster switching and efficiency.

As disclosed herein, a package may include semiconductor die with a power stage and a control die on opposing surfaces of a first leadframe and a second leadframe providing a ground return path within the package and facilitating conductive cooling from the power stage. The disclosed techniques integrate a control die and power stage of an intelligent power module within a single package. Including a ground return path within the package provides for a lower impedance for electronic signals between the power stage and a control die as compared to packages that rely on the ground plane of the underlying circuit, such as a PCB. Reducing the impedance of the signal path may mitigate voltage overshoot, thereby facilitating higher frequency communications, as voltage overshoot can interfere with signal transmission.

With an integrated control die, the direct connection between a control die and a power stage is limited to the signal conductor within the package. By further including a ground return path within the package, the impedance loop may be further limited by being fully contained within conductors of the package. Limiting the impedance of the signal loop may mitigate voltage overshoot of the electronic signals between semiconductor dies, thereby facilitating higher frequency communications between the semiconductor dies. The disclosed techniques are applicable to any semiconductor dies, and may be particularly useful higher frequency transmissions, such as gallium nitride (GaN) dies. For example, GaN architecture, such as GaN-on-silicon or GaN-on-silicon carbide, have been demonstrated as supporting higher frequencies as compared to silicon architecture or gallium arsenide architecture.

The disclosed techniques further address cooling for the power stage. For example, in high voltage applications, such as voltages of at least 100 volts (DC and/or AC), power stage components on the high voltage side of an intelligent power module (as opposed to control die components, which operate at a low voltage and/or low power) may generate significant heat which needs to be dissipated to allow for reliable and continued operation of all components in the intelligent power module.

As an example, a semiconductor die forming the power stage may be arranged on a second leadframe, the second leadframe also providing a ground return path for the signal loop, to facilitate heat transfer therethrough. Moreover, the second leadframe may have a relatively larger nominal thickness to further facilitate heat transfer. Package 10, as described with respect to FIGS. 1A and 1B, provides one example of these techniques.

Figure 1B:
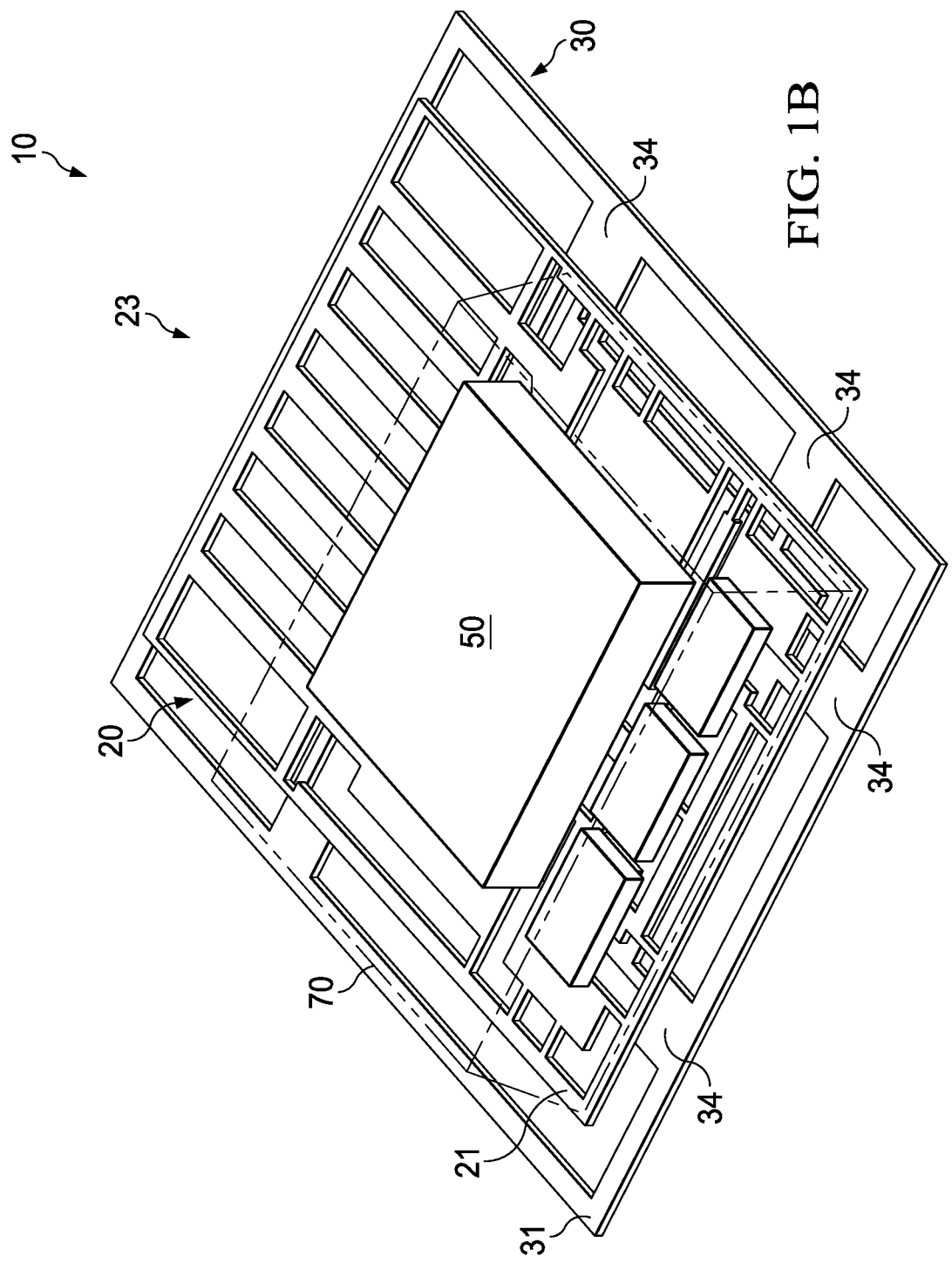
Figure 2A:
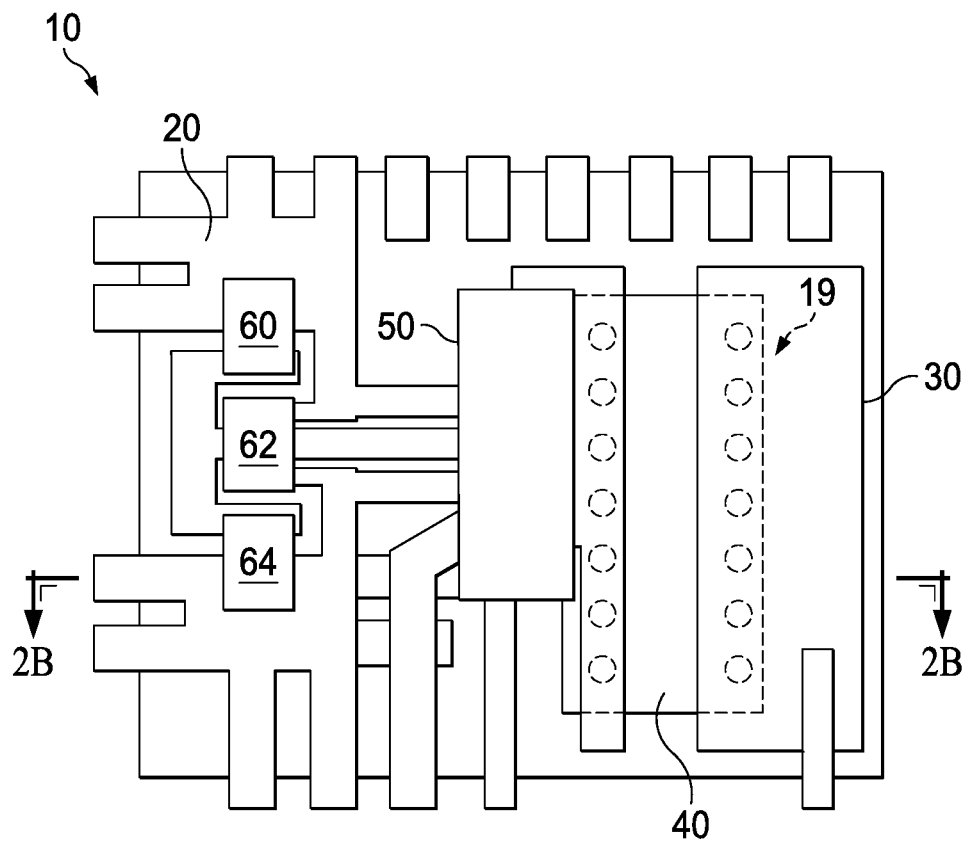
FIGS. 2A and 2B are conceptual top and cross section side views of the semiconductor package of 1A and 1B.
Figure 2B:
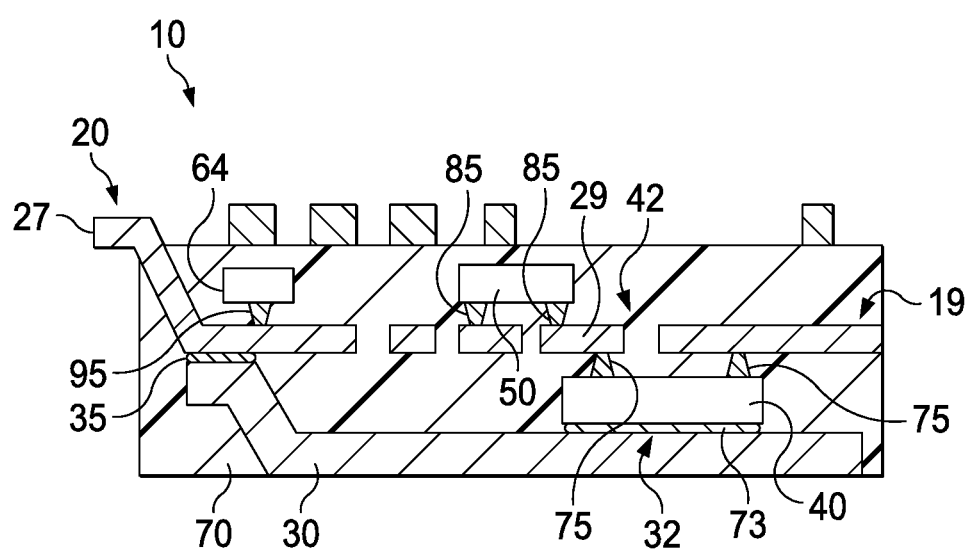

FIGS. 1A and 1B illustrate semiconductor package 10. In particular, FIG. 1A is an exploded view of package 10, while FIG. 1B is a perspective view of package 10. In addition, FIGS. 2A and 2B are conceptual top and cutaway side views of package 10. Package 10 includes semiconductor die 40 with a power stage, such as a single channel power FET, and a control die 50 mounted on opposing surfaces of leadframe 20. Specifically, semiconductor die 40 is mounted in a flipchip arrangement at die attach site 42, and control die 50 is mounted in a flipchip arrangement at die attach site 51. Package 10 further includes leadframe 30, which provides a ground return path within the package for signals between semiconductor die 40 and control die 50. Leadframe 30 further facilitates conductive cooling from semiconductor die 40.

Semiconductor die 40 forms at least one power stage, such as an FET, a junction FET (JFET), a metal-oxide-semiconductor field-effect transistor (MOSFET), a metal-semiconductor field-effect transistor (MESFET), an insulated-gate bipolar transistor (IGBT), a bipolar junction transistor (BJT), a thyristor, an integrated gate commutated thyristor (IGCT), a silicon controlled rectified (SCR), a triode for alternating current (TRIAC), a high electron mobility transistor (HEMT), a uni junction transistor (UJT), or other power stage or combination thereof. In various examples, semiconductor die 40 may form more than one power stage, such as a half bridge, a power converter, such as a Buck converter or boost converter, or other power switch configuration. Any suitable semiconductor technology may be used for semiconductor die 40 and the power stage(s), including, but not limited to, silicon, GaN, silicon carbide (SiC), aluminum nitride (AlN), indium nitride (InN), boron nitride (BN), and silicon-germanium (SiGe).

Leadframe 20 includes conductive elements 19 (FIGS. 2A and 2B) including leads 23 and power stage gate conductor 29, as well as a siderail 21 located about a perimeter of leadframe 20. Leads 23 provide electrical contacts for connection to external components, e.g., via a PCB, whereas power stage gate conductor 29 provides a connection for signals between control die 50 and semiconductor die 40. Leads 23 include power stage source lead 24, power stage drain lead 25, control power input lead 26, ground lead 27, and control input lead 28, drive strength selection lead 55, power output lead 63, and fault output lead 65. These leads 23 are merely examples and leadframe 20 may include fewer, different leads, or additional leads configured to connect to external components as needed to support the operation of package 10.

In addition, the functionality of power stage gate conductor 29, power stage source lead 24, and power stage drain lead 25 may vary according to the power stage configuration of semiconductor die 40. For example, in an implementation in which semiconductor die 40 includes a BJT power stage, power stage gate conductor 29 may connect to a base of the BJT, power stage source lead 24 may connect to an emitter of the BJT, and power stage drain lead 25 may connect to a collector of the BJT. Thus, while the terms gate, source, and drain are generally associated with FET power stages, the techniques disclosed herein also apply to other power stages, such as IGBT, BJT, thyristor, IGCT, SCR, TRIAC, HEMT, and UJT power stages.

Control die 50 is a semiconductor die, such as an integrated circuit, configured to control the power switch elements of semiconductor die 40. Control die 50 is arranged on a first surface of leadframe 20 such that it is physically and electrically connected to conductive elements of leadframe 20. Likewise, semiconductor die 40 is arranged on an opposing second surface of leadframe 20 such that it is physically and electrically connected to conductive elements of leadframe 20 at die attach site 42. Package 10 further includes passive components 60, 62, 64. Passive components 60, 62, 64 are arranged on the same surface of leadframe 20 as control die 50 such that such that each of passive components 60, 62, 64 are physically and electrically connected to conductive elements of leadframe 20.

As shown in FIG. 2A, when viewed in a plane perpendicular to a nominal thickness of leadframe 20, such as the plane of view of FIG. 2A, a profile of the control die 50 overlaps a profile of semiconductor die 40. For example, as shown in FIG. 2B, control die 50 and semiconductor die 40 connect to opposing sides of leadframe 20 at power stage gate conductor 29. The overlapping profiles of control die 50 and semiconductor die 40 allow electrical connections to their electrical contacts to be closely located on opposing sides of leadframe 20, thereby limiting the impedance of a signal loop for electronic signals between control die 50 and semiconductor die 40.

Figure 3:
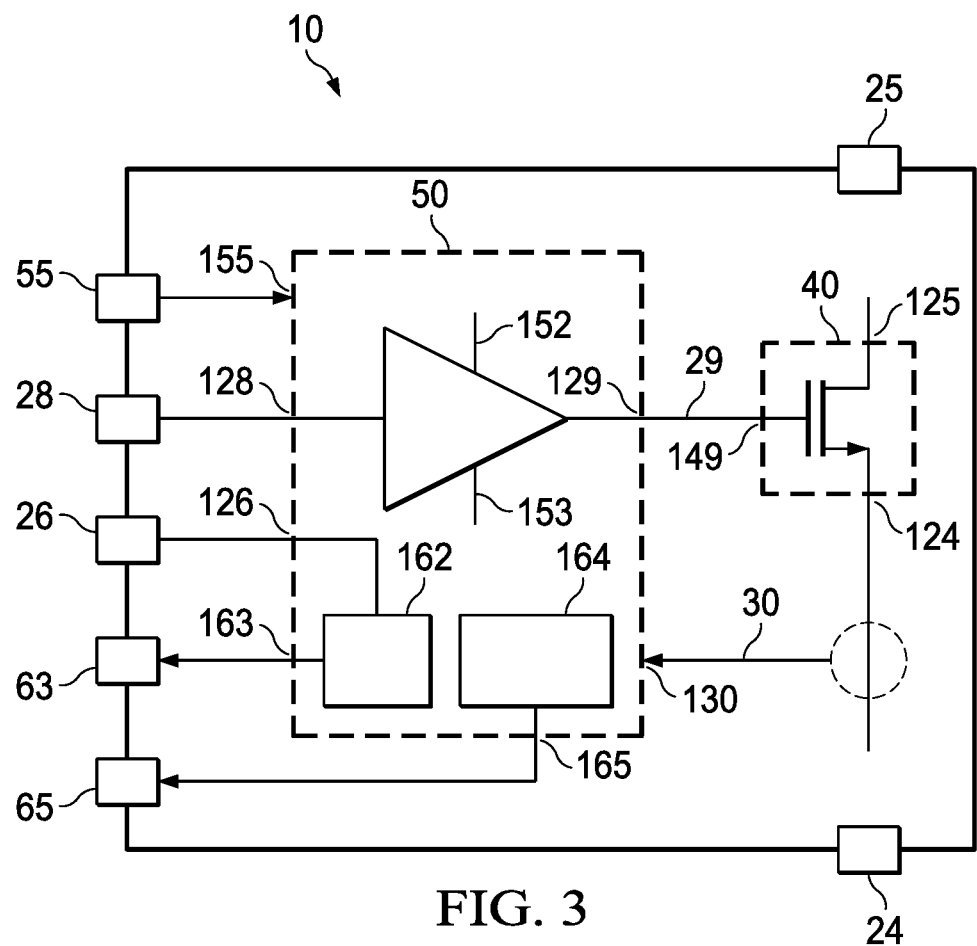
FIG. 3 is a simplified block diagram of one example configuration of the semiconductor package of 1A and 1B.

As described in further detail with respect to FIG. 3, control die 50 forms a plurality of control die electrical contacts, and semiconductor die 40 includes a plurality of die electrical contacts. The control die electrical contacts include a control input, a gate drive output, and a control power input. Specifically, the control input is electrically coupled to control input lead 28, the gate drive output is electrically coupled to the power stage gate conductor 29, and the control power input is electrically coupled to control power input lead 26. The die electrical contacts include power stage source, power stage drain and a power stage gate, which are electrically coupled to leadframe 20 at die attach site 42. The power stage source is electrically coupled to power stage source lead 24, power stage drain is electrically coupled to the power stage drain lead 25, and the power stage gate is electrically coupled to power stage gate conductor 29.

Leadframe 20, control die 50 and semiconductor die 40 may also include additional leads, conductive elements, and electrical contacts to provide support various functions of package 10. Such functions may include a low voltage power converter to serve control die 50, passive components 60, 62, 64 and/or external components. Additional functions may improve performance and reliability, such as over-current protection, over-temperature protection, and under voltage lockout. Passive components 60, 62 and 64 may provide sensing, energy storage, or other functions as part of power conversion, over-current protection, over-temperature protection, and under voltage lockout for semiconductor die 40. For example, passive components 60, 62, 64 may be electrically coupled to control die 50 via leadframe 20. Passive components 60, 62, 64 are merely conceptual examples, and passive components 60, 62, 64 may represent any number of components included in package 10, such as inductors, capacitors, resistors, diodes, passive sensors, or other components that support the functionality of package 10, control die 50 and semiconductor die 40.

Leadframe 30 includes a siderail 31 surrounding a die attach pad 32, with semiconductor die 40 arranged on the surface of leadframe 30 to facilitate heat transfer therethrough. Leadframe 30 further includes bonding pads 34, which physically and electrically connect to grounded elements of leadframe 20 such that leadframe 30 maintains a ground potential. This allows leadframe 30 to serve as a ground return path for electronic signals between semiconductor die 40 and control die 50.

While it is generally preferable to limit thicknesses of components within package 10, a nominal thickness of leadframe 30 may be selected to improve heat dissipation from semiconductor die 40. For example, the nominal thickness of leadframe 30 may be greater than the nominal thickness of leadframe 20. In some specific examples, leadframe 30 may have a nominal thickness at least twice the nominal thickness of leadframe 20. In the same or different examples, leadframe 30 may have a nominal thickness of at least at least 300 micrometers, such as at least 400 micrometers, such as about 500 micrometers, while leadframe 20 has a nominal thickness of less than 250 micrometers, such as about 200 micrometers. As used herein, the term, "about" means within the range of manufacturing tolerances associated with the particular element being described numerically.

Leadframes, such as leadframes 20, 30, are formed on a single, thin sheet of metal as by stamping or etching. The stacking of leadframes 20, 30 within a single package provides routable layers for complex circuit structures accommodating both control signals and power transmission of a power stage. Providing routable layers with stacked leadframes increases the density of a power stage and its control die compared to alternatives which utilize single leadframe designs. In addition, the routable layers allow for ground return paths within a package for electric signals between multiple elements of the package such as control die 50 and semiconductor die 40. This provides relative low package parasitics as compared to alternatives which rely on the ground plane of the underlying circuit by reducing the impedance of the signal loops.

While package 10 may include any semiconductor die architecture, its low signal loop impedance may be particularly useful for semiconductor die 40 and control die 50 utilizing higher frequency transmissions. For example, one or both of semiconductor die 40 and control die 50 may include GaN architecture, such as GaN-on-silicon or GaN-on-silicon carbide. In the same or different examples, one or both of semiconductor die 40 and control die 50 may include silicon architecture and/or gallium arsenide architecture. In one particular example, semiconductor die 40 may include GaN architecture, and control die 50 may include silicon architecture.

In addition, control die 50 may be specifically tuned to for a GaN configuration for semiconductor die 40 for fast driving while mitigating ringing on the gate. For example, control die 50 may be configured to keep semiconductor die 40 off for high drain slew rates, such as slew rates up to 150 V/ns. In addition, control die 50 may protect against faults by providing over-current protection, over-temperature protection, and/or under voltage lockout for semiconductor die 40. As control die 50 is an integrated component of package 10, the fault protection may be designed according to the specifications of semiconductor die 40, thereby simplifying the design of electronics utilizing package 10 as compared to alternatives in which fault protection for a semiconductor die is provided by separate components.

Mold compound 70 forms an overmold that covers semiconductor die 40, control die 50, passive components 60, 62, 64, both sides of leadframe 20 and one side of leadframe 30. In this manner, mold compound 70 provides a protective outer layer for the electric components of package 10. In other examples, a mold compound may only partially cover control die 50, and/or passive components 60, 62, 64, e.g., to allow for additional conductive cooling of such components. The exposed surface of leadframe 30 facilitates heat transfer from semiconductor die 40 to the external environment. Such heat transfer may be further improved by positioning the exposed surface of leadframe 30 on a heat sink.

Multiple interconnected leadframes may be formed on a single leadframe sheet, the interconnected leadframes referred to as a leadframe strip. Leadframes on the sheet can be arranged in rows and columns. Tie bars connect leads and other elements of a leadframe to one another as well as to elements of adjacent leadframes, such as siderails 21, 31, in a leadframe strip.

Usually die mounting, die to lead attachment (for example, solder reflow) and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser to remove tie bars. These singulation cuts separate the leadframe strip into separate semiconductor packages, each semiconductor package including a singulated leadframe, at least one die, electrical connections between the die and leadframe (such as solder reflow connections) and the mold compound which covers at least part of these structures. Tie bars and the siderails may be removed during singulation of the packages.

Package 10 may be operated as a component of an intelligent power supply or other power control device. In various examples, package 10 may be utilized as part of a half-bridge, a boost converter, a buck converter, and others. In such examples, semiconductor die 40 may represent a single power stage or include multiple power stages.

FIG. 3 illustrates a specific example simplified block diagram of an example configuration of semiconductor package 10 where semiconductor die 40 represents a single channel power FET. Control die 50 is configured to control switching of the power FET of semiconductor die 40 with an electrical signal over power stage gate conductor 29 via its gate drive output 129. Leadframe 30 provides a ground return path between control die 50 and semiconductor die 40 for the electrical signal. Leadframe 30 may also provide a ground return path between source 124 and drain 125 of the power FET of semiconductor die 40.

In many examples, semiconductor die 40 with its power FET operates at a higher current and/or voltage than control die 50. For example, a voltage rating of the power FET for either source 124 or drain 125 may be at least 100 volts, such as at least 200 volts, such as at least 400 volts. In contrast, the power FET of semiconductor die 40 may be operable via power stage gate 149 with a signal providing no more than ten percent of the voltage rating of the power FET for either source 124 or drain 125, such as a signal of less than two percent of the voltage rating, such as voltage of less than 15 volts.

As shown in FIG. 3, semiconductor die 40 includes an electrical contact forming source 124, which connects to source lead 24 and an electrical contact forming drain 125 which comments to drain lead 25, e.g., via solder reflow connections. Source 124 and drain 125 are provided via leadframe 20 (not shown). While only a single source and drain are shown in the block diagram, package 10 may utilize a number of contacts for each of source 124 and drain 125 to facilitate high current operation of semiconductor die 40. Semiconductor die 40 further includes power stage gate 149 electrically coupled to power stage gate conductor 29, e.g., via a solder reflow connections.

In addition, package 10 includes a number of electrical contacts that directly connect to control die 50 via leadframe 20 (not shown), e.g., via solder reflow connections. Specifically, control die 50 is arranged on a surface of leadframe 20 such that control input 128 is electrically coupled to control input lead 28, gate drive output 129 is electrically coupled to the power stage gate conductor 29, control power input 126 is electrically coupled to control power input lead 26, and ground contact 130 is electrically coupled to ground lead 27 (not shown) and leadframe 30. In addition, package 10 further includes additional connections for gate drive supply 152 and negative gate supply output 153.

In the specific example of FIG. 3, control die 50 further includes additional electrical contacts: drive strength selection 155 electrically coupled to drive strength selection lead 55, power output 163 electrically coupled to power output lead 63, and fault output 165 electrically coupled to fault output lead 65.

Drive strength selection lead 55 is configurable to adjust a slew rate to control stability and ringing in the circuit, as well as an adjustment to pass electro-magnetic compliance (EMC) standards. In some examples, a resistor may be electrically connected the drive strength selection lead 55 and ground. The value of the resistor determines the slew rate of the device during turn-on, such as between approximately 25 V/ns and 100 V/ns. The slew rate adjustment can be used to control the following aspects of the power FET of semiconductor die 40: switching loss in a hard-switched converter, radiated and conducted EMI generated by the switching stage, interference elsewhere in the circuit coupled from the switch node, and/or voltage overshoot and ringing on the switch node due to power loop inductance and other parasitics. When increasing the slew rate, the switching power loss will decrease, as the portion of the switching period where the switch simultaneously conducts high current while blocking high voltage is decreased. However, by increasing the slew rate of the device, the other three aspects of the power FET become less desirable.

Control power input lead 26 may supply both power output lead 63 and gate drive supply 152. For example, power converter circuit 162 may provide a required power (such as 5 volts DC) for power output lead 63 and gate drive supply 152 by converting a power received via control power input lead 26, which may be at a different potential (such as 12 volts DC). In some examples, power output lead 63 may be electrically connected to an external digital isolator.

In the example of FIG. 3, passive components 60, 62, 64 of FIGS. 1A and 1B are represented as circuits 162, 164. Circuit 162 may include passive components electrically coupled to control die 50 to provide power conversion. Sensing circuit 164 may include passive components electrically coupled to control die 50 to provide sensing functions for over-current protection, over-temperature protection, and/or under voltage lockout for semiconductor die 40. For example, sensing circuit 164 may provide current sensing and/or voltage sensing for source 124 and/or drain 125. As another example, sensing circuit 164 may provide temperature sensing for semiconductor die 40 or package 10 generally. Detected faults may be output over fault output 165 via fault output lead 65.

FIGS. 4A-4F illustrate conceptual process steps for manufacturing semiconductor package 10. FIG. 5 is flowchart of a method of manufacturing package 10. For clarity, the techniques of FIG. 5 are described with respect to package 10 and FIGS. 4A-4F; however, the described techniques may be adapted to other package designs and are not limited to the specific example of package 10.

Figure 4A:
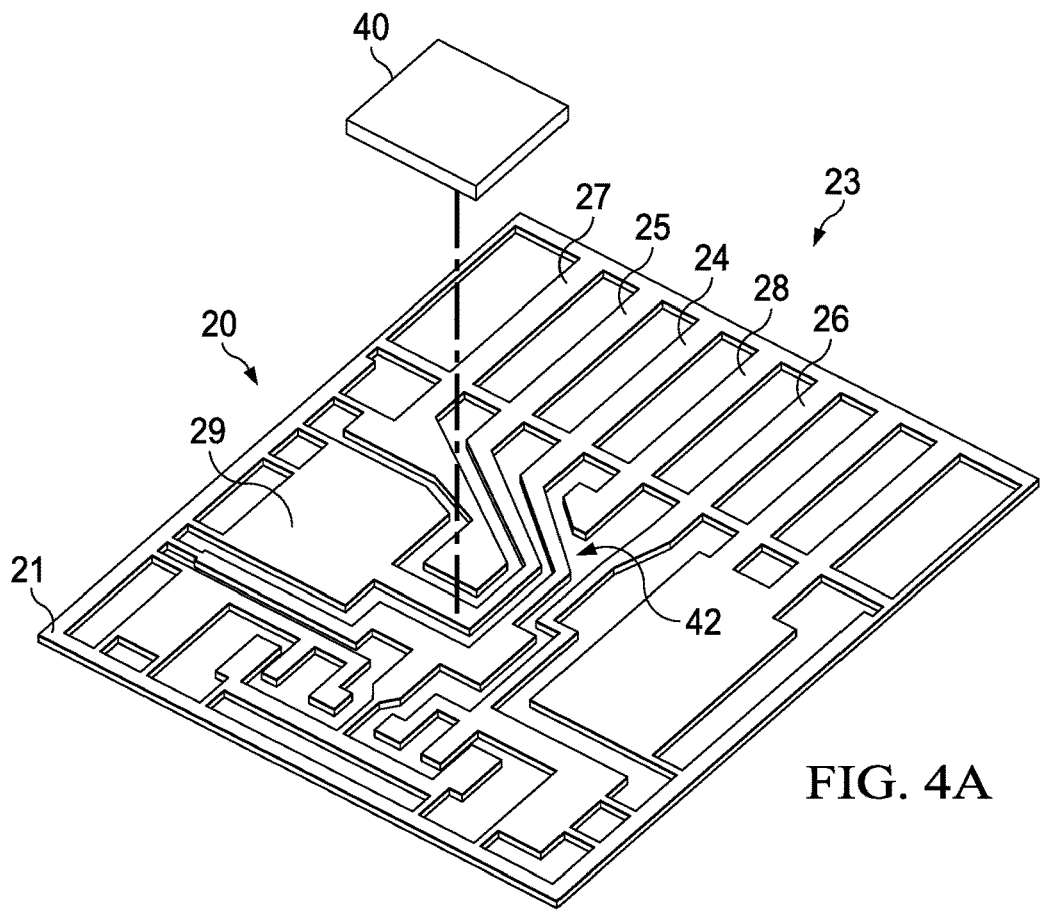
FIGS. 4A-4F illustrate conceptual process steps for manufacturing the semiconductor package of 1A and 1B.
Figure 4B:
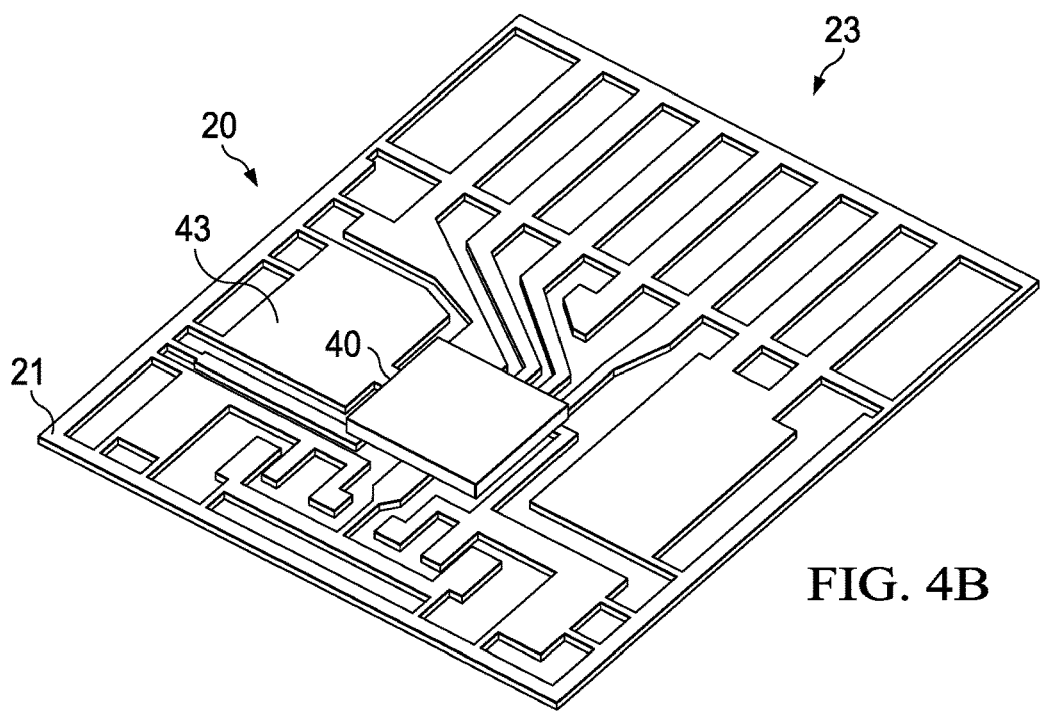
Figure 5:
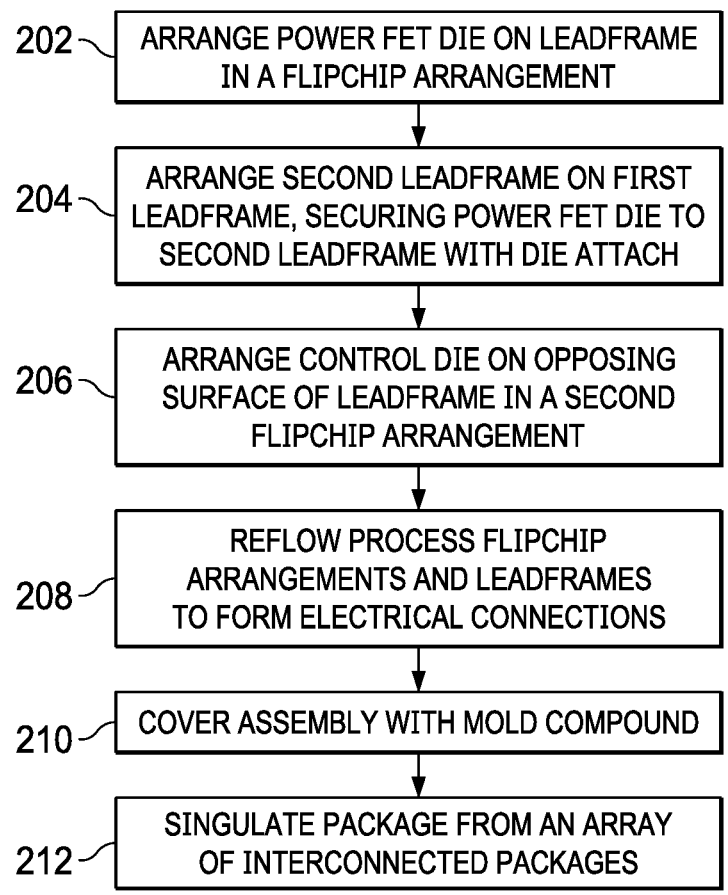
FIG. 5 is a flowchart of a method of manufacturing a semiconductor package including a power stage and a control die on opposing surfaces of a first leadframe, and a second leadframe that provides a ground return path within the package and facilitates conductive cooling from the power stage, such as the semiconductor package of 1A and 1B.

As shown in FIGS. 4A and 4B, semiconductor die 40 is arranged on a surface 43 of leadframe 20 at die attach site 42 in a first flipchip arrangement such that the power stage source 124 is electrically coupled to the power stage source lead 24, the power stage drain 125 is electrically coupled to the power stage drain lead 25, and the power stage gate 149 is electrically coupled to the power stage gate conductor 29 (202).

Figure 4C:
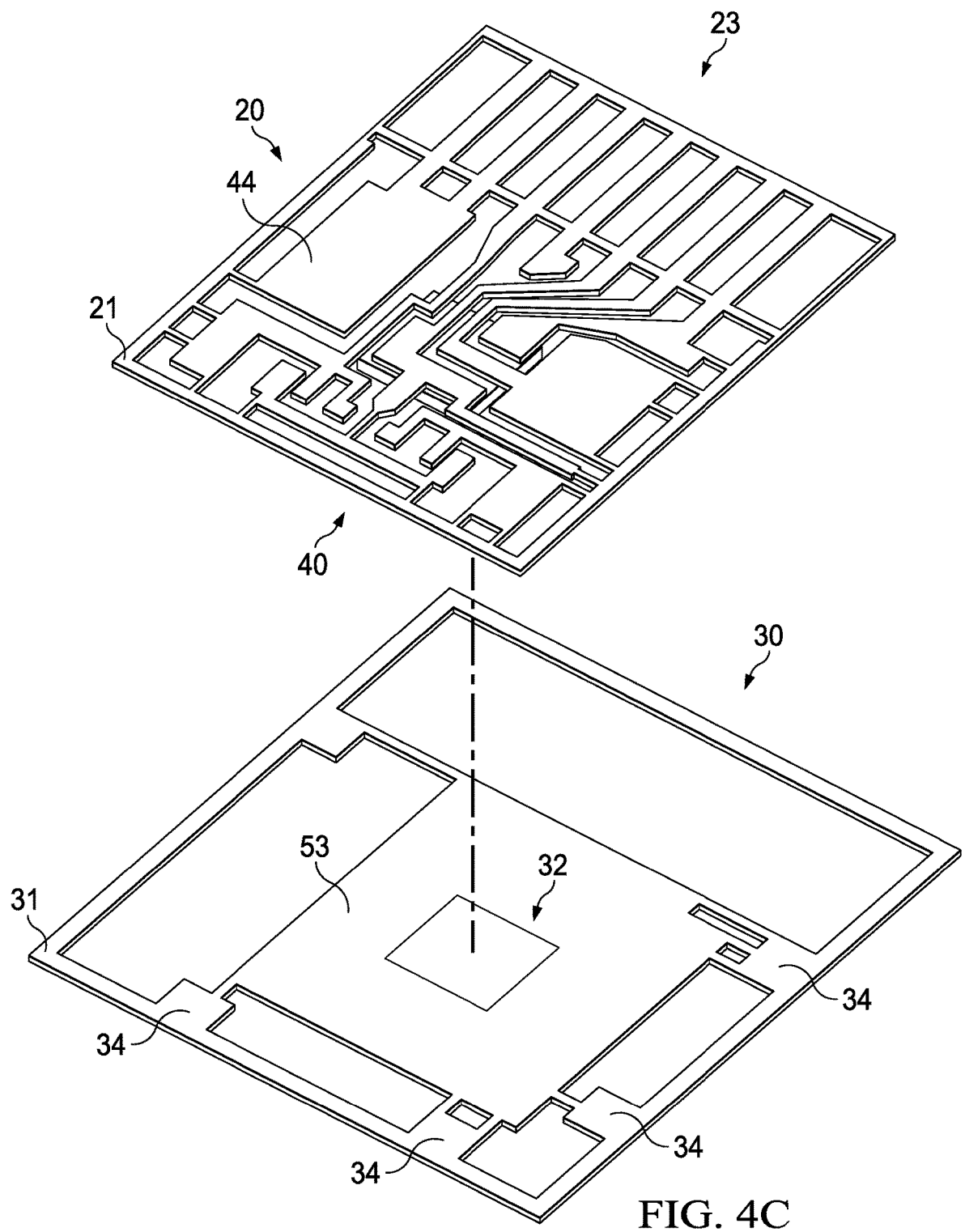

As shown in FIG. 4C, leadframe 30 is arranged on leadframe 20 such that semiconductor die 40 is arranged on a surface 53 of leadframe 30 to facilitate heat transfer therethrough (204). Semiconductor die 40 is coupled to leadframe 30 in that it is physically and thermally connected to leadframe 30 with die attach 73 (FIG. 2B). In various examples, die attach 73 may either be a conductive die attach, such as silver paste, or a nonconductive die attach, such as an epoxy.

Figure 4D:
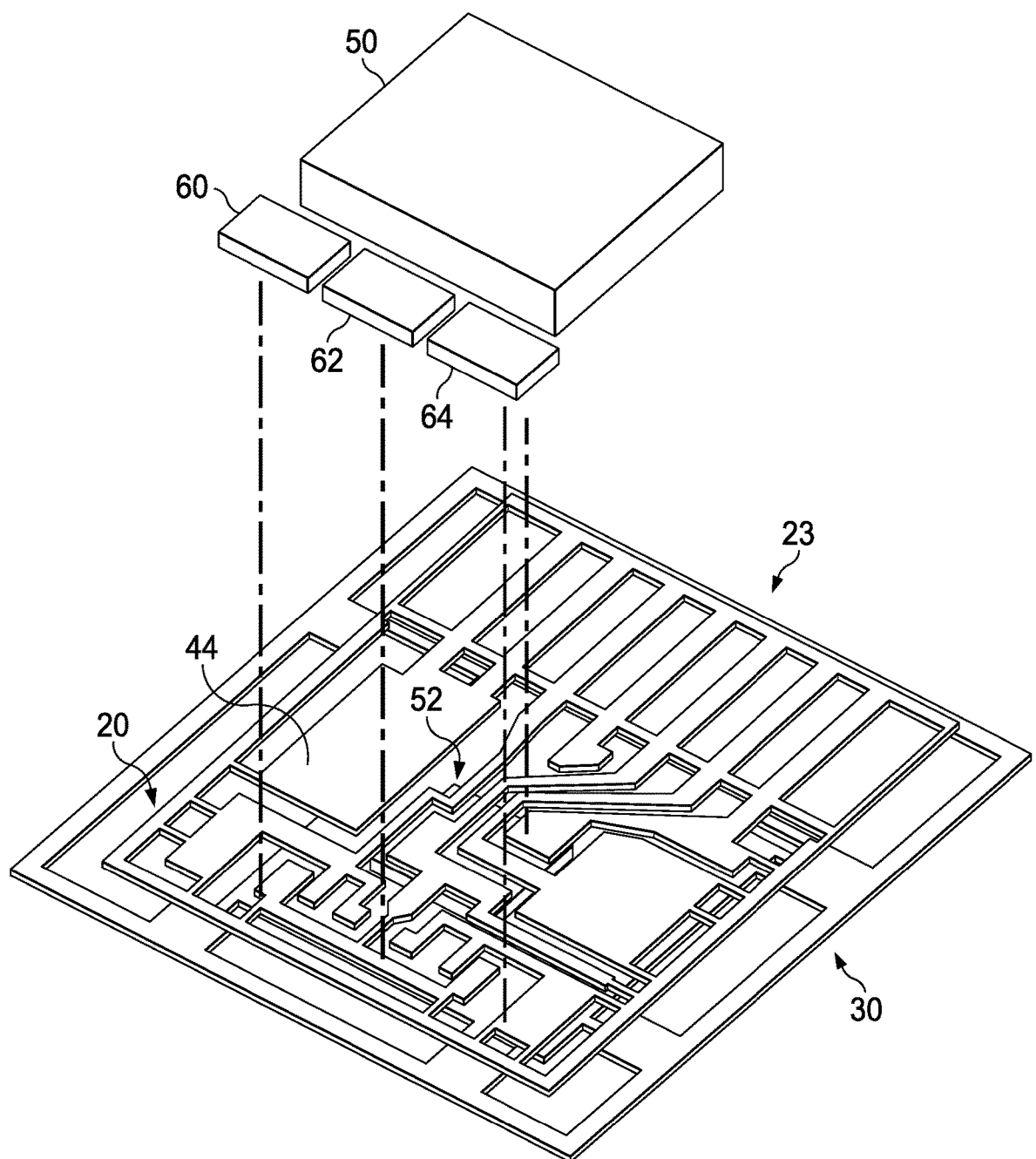
Figure 4E:
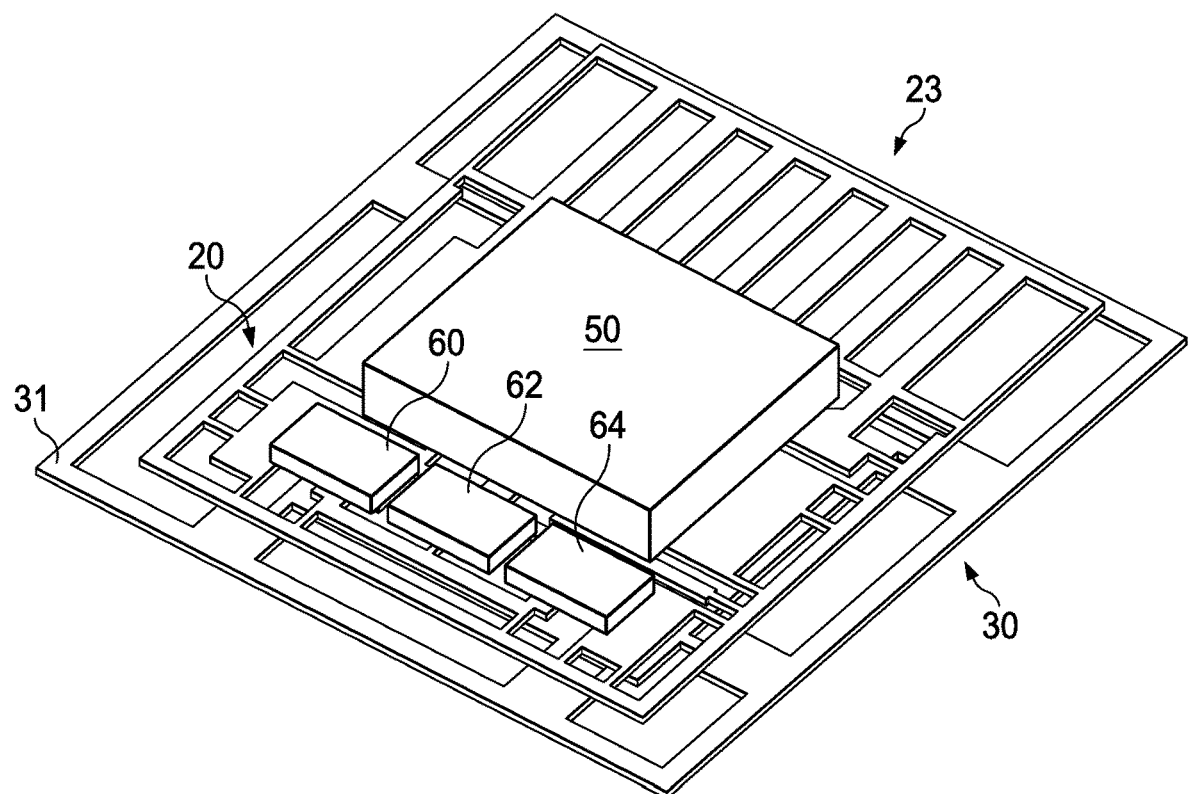

As shown in FIGS. 4D and 4E, control die 50 is arranged on an opposing surface 44 of leadframe 20 compared to semiconductor die 40 (206). Specifically, control die 50 is arranged on surface 44 of leadframe 20 at die attach site 52 in a second flipchip arrangement such that control input 128 is electrically coupled to control input lead 28, gate drive output 129 is electrically coupled to the power stage gate conductor 29, and control power input 126 is electrically coupled to control power input lead 26. Passive components 60, 62, and 64 are also arranged on the opposing surface of leadframe 20 compared to semiconductor die 40.

While not directly illustrated in FIGS. 4A-4F, electrical connections are formed in conjunction with the assembly of leadframe 20, semiconductor die 40, leadframe 30 and control die 50. Physical and electrical connections are formed by reflow processing sets of solder bumps (208). For example, semiconductor die 40 is physically and electrically secured to leadframe 20 at die attach site 42 by reflow processing a set of solder bumps to form solder reflows 75 (FIG. 2B). Control die 50 is physically and electrically secured to leadframe 20 at die attach site 52 by reflow processing a second set of solder bumps to form solder reflows 85 (FIG. 2B). In addition, passive components 60, 62, 64 are physically and electrically secured to leadframe 20 by reflow processing additional solder bumps to form solder reflows, such as solder reflows 95 shown with respect to passive component 64 (FIG. 2B). Similarly, leadframe 30 is physically and electrically secured to leadframe 20 at bonding pads 34 by reflow processing another set of solder bumps to form solder reflows 35 (FIG. 2B). The electrical connections between leadframe 20 and leadframe 30 by solder reflows 35 at bonding pads 34 provide a ground return path including leadframe 30 for electrical signals between control die 50 and semiconductor die 40.

In various examples, reflow processing to form solder reflows 35, 75, 85, 95 may be performed serially or in unison or a combination thereof. When reflow processing occurs serially, it is important that completed solder reflows are not melted during the formation of additional solder reflows. For this reason, the melting temperature of completed solder reflows should be higher than the melting temperature of solder bumps for later solder reflows. For example, if semiconductor die 40 is attached to leadframe 20 with solder reflows 75 before control die 50 is attached to leadframe 20 with solder reflows 85, the melting temperature for solder reflows 75 should be higher than the melting temperature of solder reflows 85. Likewise, if control die 50 and passive component 64 are attached to leadframe 20 with solder reflows 85, 95 before leadframe 30 is attached to leadframe 20 with solder reflows 35, the melting temperature for solder reflows 85, 95 should be higher than the melting temperature of solder reflows 35. Conversely, if leadframe 30 is attached to leadframe 20 with solder reflows 35 before control die 50 and passive component 64 are attached to leadframe 20 with solder reflows 85, 95, the melting temperature for solder reflows 35 should be higher than the melting temperature of solder reflows 85, 95.

In other examples, solder reflows 35, 75, 85, 95 may be formed in unison by reflow processing a completed assembly of leadframe 20, semiconductor die 40, leadframe 30, control die 50, and passive components 60, 62, 64. In such an example, semiconductor die 40 may be precisely positioned and secured to leadframe 30 at die attach pad 32 (FIG. 4C) with die attach 73 before leadframe 30 is precisely positioned aligned relative to leadframe 20 to locate semiconductor die 40 at die attach site 42 on surface 43 of leadframe 20. Before reflow processing, control die 50, and passive components 60, 62, 64 are also precisely located at their respective positions on surface 44 of leadframe 20. During a single reflow processing, solder reflows 35, 75, 85, 95 may then be formed in unison to electrically and physically connect leadframe 20, semiconductor die 40, leadframe 30, control die 50, and passive components 60, 62, 64 as described above.

In a modified example, solder reflows 85, 95 may be formed in unison by first reflow processing a subassembly including leadframe 20, control die 50, and passive components 60, 62, 64. In such an example, semiconductor die 40 may be precisely positioned and secured to leadframe 30 at die attach pad 32 (FIG. 4C) with die attach 73 before leadframe 30 is precisely positioned aligned relative to leadframe 20 to locate semiconductor die 40 at die attach site 42 on surface 43 of leadframe 20. After locating the assembled leadframe 30 and semiconductor die 40 relative to the subassembly including leadframe 20, control die 50, and passive components 60, 62, 64, a second reflow processing step may form solder reflows 35, 75 in unison.

Figure 4F:
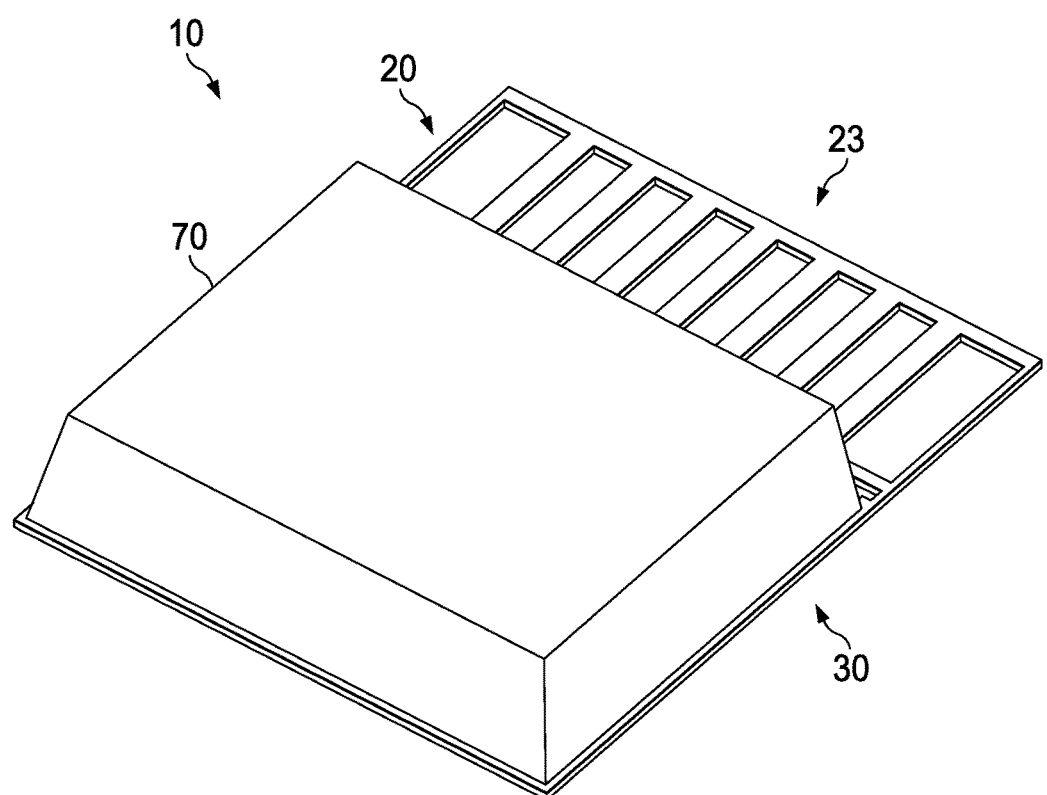

As shown in FIG. 4F, the assembly of leadframes 20, 30, semiconductor die 40, control die 50 and passive components 60, 62, and 64 is covered in mold compound, leaving a surface of leadframe 30 opposite semiconductor die 40 exposed (210).

In examples, in which package 10 is mounted as part of a leadframe strip, following molding of mold compound 70, package 10 is singulated from an array of interconnected packages manufactured on common leadframes including leadframe 20 and leadframe 30 (212). For example, singulation may include cutting through mold compound 70 and removing tie bars and/or siderails surrounding the interconnected leadframes with a saw or other cutting implement.

Figure 6A:
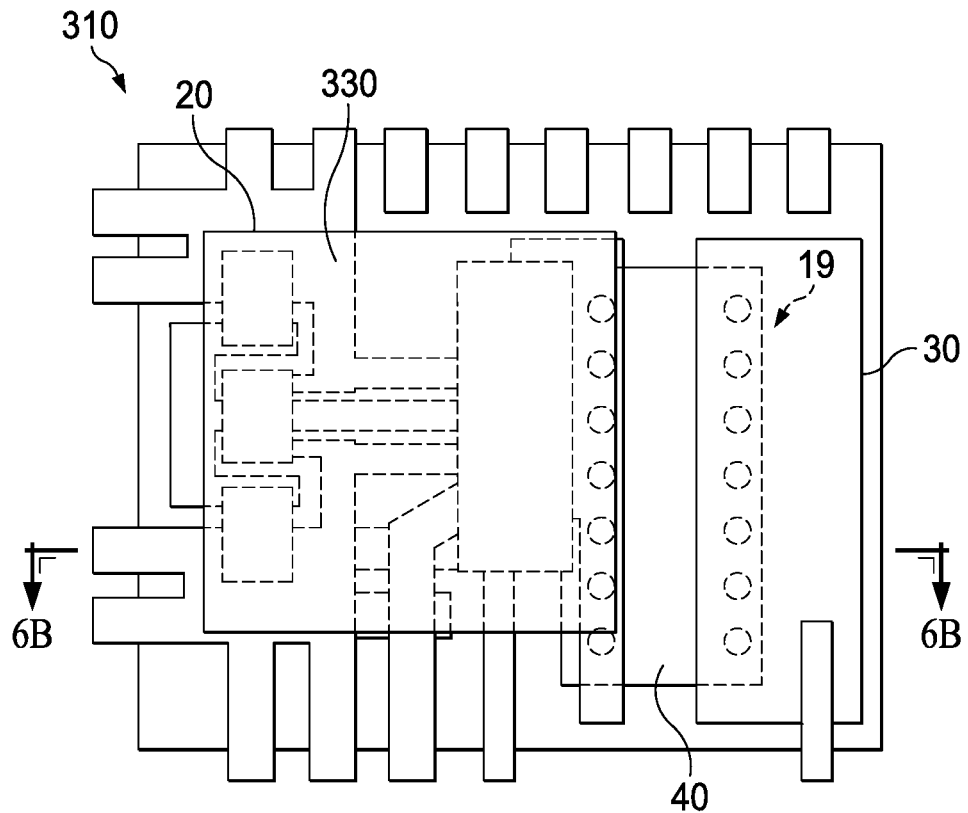
FIGS. 6A and 6B are conceptual top and cross section side views of a semiconductor package similar to the semiconductor package of 1A and 1B, with the addition of a third leadframe facilitating conductive cooling from the control die.
Figure 6B:
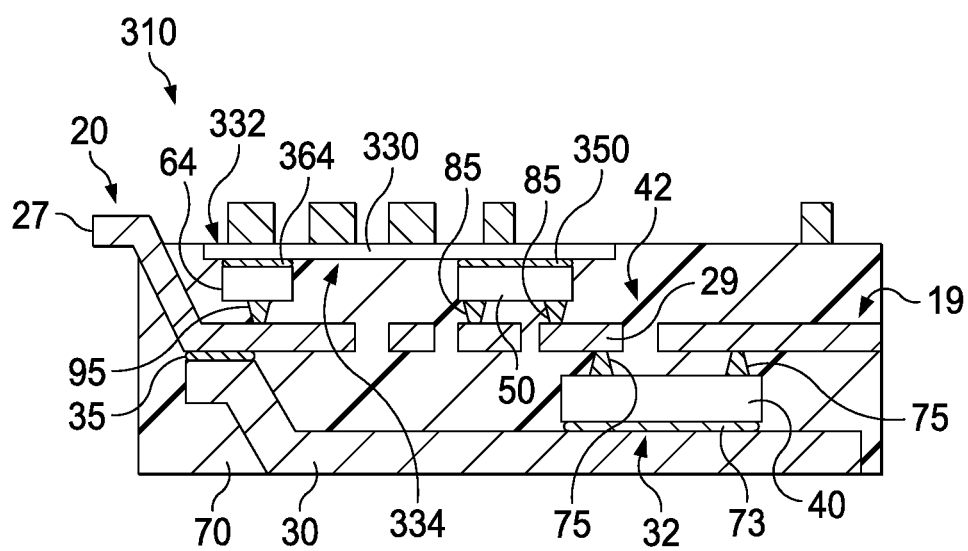

FIGS. 6A and 6B illustrate top and cutaway side views of a conceptual semiconductor package 310. Package 310 is substantially similar to semiconductor package 10 with the addition of a third leadframe 330. Except as specifically noted, the description of package 10 applies to package 310. For example, package 310 includes semiconductor die 40 with a power stage, such as a single channel power FET, and a control die 50 mounted on opposing surfaces of leadframe 20. Package 310 further includes leadframe 30, which provides a ground return path within the package for signals between semiconductor die 40 and control die 50. Leadframe 30 further facilitates conductive cooling from semiconductor die 40. For brevity, additional details included in the description of package 10 are not repeated with respect to package 310.

Leadframe 330 includes a first surface 332 and a second surface 334 opposing the first surface 332. Leadframe 330 facilitates conductive cooling of control die 50 in that control die 50 is arranged on the second surface 334 of the second leadframe to facilitate heat transfer therethrough. Leadframe 330 may also facilitates conductive cooling of one or more of passive components 60, 62, 64.

For example, control die 50 may be coupled to leadframe 330 in that it is physically and thermally connected to leadframe 330 with die attach 350 (FIG. 6B). Passive components 60, 62, 64 are also optionally physically and thermally connected to leadframe 330, such as passive component 64 with die attach 364 (FIG. 6B). In various examples, die attach 350, 364 may include conductive die attach, such as silver paste, and/or nonconductive die attach, such as an epoxy.

Mold compound 70 forms an overmold that covers semiconductor die 40, control die 50, passive components 60, 62, 64, both sides of leadframe 20, one side of leadframe 30, and the side of leadframe 330 including surface 334. In this manner, mold compound 70 provides a protective outer layer for the electric components of package 10. The exposed surface of leadframe 30 facilitates heat transfer from semiconductor die 40 to the external environment. Likewise, the exposed surface of leadframe 330 facilitates heat transfer from control die 50 and passive components 60, 62, 64 to the external environment. Such heat transfer may be further improved by positioning exposed surfaces of leadframes 30, 330 on heat sinks.

While it is generally preferable to limit thicknesses of components within package 310, a nominal thickness of leadframe 330 may be selected to improve heat dissipation from control die 50 and passive components 60, 62, 64. For example, the nominal thickness of leadframe 330 may be greater than the nominal thickness of leadframe 20. In some specific examples, leadframe 330 may have a nominal thickness at least twice the nominal thickness of leadframe 20. In the same or different examples, leadframe 330 may have a nominal thickness of at least at least 300 micrometers, such as at least 400 micrometers, such as about 500 micrometers, while leadframe 20 has a nominal thickness of less than 250 micrometers, such as about 200 micrometers. In other examples, leadframe 330 may have a nominal thickness no greater than or equal to the nominal thickness of leadframe 20 while leadframe 30 has a nominal thickness greater than the nominal thickness of leadframe 20. For example, because semiconductor die 40 includes a power stage, semiconductor die 40 may be expected to generate more heat than control die 50 and/or passive components 60, 62, 64 such that a greater thickness is warranted for leadframe 30, but not leadframe 330.

In some examples leadframe 330 may be electrically connected to leadframe 20, such as to provide a ground plane (via ground lead 27) or power plane (via control power input lead 26) for package 310. Such electrical connections between leadframe 330 and leadframe 20 may be formed with bonding pads and solder reflows in the same manner as described with respect to bonding pads 34 and solder reflows 35 for leadframe 30. In other examples, leadframe 330 may not be electrically connected to leadframe 20 within package 10. In some of such examples, leadframe 330 may be electrically connected to an underlying circuit, such as to ground or to a powered connection. For example, leadframe 330 may form a lead and an external electrical contact for package 310 to facilitate a such an electrical connection to an underlying circuit.

The specific techniques for packages including a semiconductor die and a control die on opposing surfaces of a first leadframe, and a second leadframe providing a ground return path within the package and facilitating conductive cooling from the semiconductor die, including techniques described with respect to semiconductor package 10 and semiconductor package 310, are merely illustrative of the general inventive concepts included in this disclosure as defined by the following claims.

What is claimed is:

1. A package comprising:
   a gallium nitride die forming a power stage including a power field effect transistor (FET) with a power stage source, a power stage drain, and a power stage gate, wherein a voltage rating of the power stage for at least one of the power stage source, and the power stage drain is at least 100 volts;
   a control die forming control die electrical contacts including a control input, a gate drive output, and a control power input;
   a first leadframe including a first surface and a second surface opposing the first surface, the first leadframe forming a die attach site, a power stage gate conductor and a plurality of leads, the plurality of leads including:

a power stage source lead, a power stage drain lead, a control input lead, and a control power input lead;

wherein the control die is arranged on the first surface of the first leadframe in a first flipchip arrangement such that the control input is electrically coupled to the control input lead, the gate drive output is electrically coupled to the power stage gate conductor, and the control power input is electrically coupled to the control power input lead, wherein the gallium nitride die is arranged on the second surface of the first leadframe at the die attach site in a second flipchip arrangement such that the power stage source is electrically coupled to the power stage source lead, the power stage drain is electrically coupled to the power stage drain lead, and the power stage gate is electrically coupled to the power stage gate conductor, wherein the power stage is operable via the power stage gate with a signal of less than 15 volts;

a second leadframe including a first surface and a second surface opposing the first surface, wherein the gallium nitride die is arranged on the first surface of the second leadframe to facilitate heat transfer therethrough; and mold compound at least partially covering the gallium nitride die, the control die, the first leadframe and the second leadframe with the second surface of the second leadframe exposed.

2. A package comprising:
a control die electrically connected to a first leadframe; and
a gallium nitride die electrically connected to the first leadframe and a second leadframe, the gallium nitride die attached to a first side of a section of the second leadframe via a die attach; and
mold compound at least partially covering the gallium nitride die, the control die, the first leadframe and the second leadframe;
wherein the section of the second leadframe to which the gallium nitride die is attached is in direct electrical connection with the first leadframe, and a second side of the section of the second leadframe to which the gallium nitride die is attached is exposed at a surface of the package.

3. The package of claim 2, wherein the gallium nitride die and the control die are arranged on two opposite sides of the first leadframe, from a cross-sectional view of the package.

4. The package of claim 2, wherein:
the gallium nitride die forms a power stage of the package with a power stage source, a power stage drain, and a power stage gate; and
the control die forms control die electrical contacts including a control input, a gate drive output, and a control power input.

5. The package of claim 4, wherein:
the first leadframe includes a power stage gate conductor and a plurality of leads, the plurality of leads including: a power stage source lead, a power stage drain lead, a control input lead, and a control power input lead; and
the control input is electrically coupled to the control input lead, the gate drive output is electrically coupled to the power stage gate conductor, and the control power input is electrically coupled to the control power input lead.

6. The package of claim 5, wherein:
the power stage source is electrically coupled to the power stage source lead, the power stage drain is electrically coupled to the power stage drain lead, and the power stage gate is electrically coupled to the power stage gate conductor.

7. The package of claim 2, wherein the second leadframe provides a ground return path between the power stage source, and the power stage drain.

8. The package of claim 2, wherein, when viewed in a plane perpendicular to a nominal thickness of the first leadframe, a profile of the control die overlaps a profile of the gallium nitride die.

9. A package comprising:
a control die electrically connected to a first leadframe,
a gallium nitride die electrically connected to the first leadframe and a second leadframe, the gallium nitride die attached to a section of the second leadframe, and
solder bumps forming electrical connections between the gallium nitride die and the first leadframe, and between the control die and the first leadframe such that the control die is mounted on the first surface of the first leadframe in a first flipchip arrangement, and the gallium nitride die is mounted on the second surface of the first leadframe in a second flipchip arrangement;
wherein the section of the second leadframe is electrically connected to the first leadframe, and the section of the second leadframe is exposed to a surface of the package.

10. A package comprising;
a control die electrically connected to a first leadframe;
a gallium nitride die electrically connected to the first leadframe and a second leadframe, the gallium nitride die attached to a section of the second leadframe; and
one or more passive components of a sensing circuit mounted on the first surface of the first leadframe and electrically coupled to the control die via the first leadframe;
wherein the section of the second leadframe is electrically connected to the first leadframe, and the section of the second leadframe is exposed to a surface of the package.

11. The package of claim 10, wherein the sensing circuit includes at least one of:
current sensing of at least one of the power stage source and the power stage drain;
voltage sensing of at least one of the power stage source and the power stage drain; and
temperature sensing of the package.

12. A package comprising:
a control die electrically connected to a first leadframe;
a semiconductor die electrically connected to the first leadframe and a second leadframe, the semiconductor die attached to a first side of a section of the second leadframe via die attach;
wherein the section of the second leadframe is in direct electrical connection with the first leadframe; and
a third leadframe attached to the control die, one side of the third leadframe exposed to a first surface of the package;
wherein a second side of the section of the second leadframe to which the semiconductor is attached is exposed at a second surface of the package, the second surface opposite the first surface.

13. The package of claim 12, wherein the semiconductor die is a gallium nitride die.

14. The package of claim 12, wherein the control die and the semiconductor die are flipchip mounted on two opposite sides of the first leadframe.

15. The package of claim 12, wherein the control die is attached to the third leadframe via die attach.

16. The package of claim 12, wherein the section of the second leadframe is mechanically attached to and in direct electrical connection with the first leadframe via solder.

17. The package of claim 12 further comprising a passive component mounted on, and electrically connected to the first leadframe, and wherein the passive component is attached to the third leadframe.

* * * * *